United States Patent
Wu et al.

(10) Patent No.: US 10,446,559 B2
(45) Date of Patent: Oct. 15, 2019

(54) METHOD OF FABRICATING DRAM

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Tzu-Chin Wu, Chiayi County (TW); Chao-An Liu, Taipei (TW); Ching-Hsiang Chang, Tainan (TW); Yi-Wei Chen, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 16/053,748

(22) Filed: Aug. 2, 2018

(65) Prior Publication Data
US 2019/0109139 A1   Apr. 11, 2019

(30) Foreign Application Priority Data
Oct. 10, 2017   (CN) .......................... 2017 1 0933813

(51) Int. Cl.
| | | |
|---|---|---|
| H01L 27/108 | (2006.01) | |
| H01L 21/308 | (2006.01) | |
| H01L 21/02 | (2006.01) | |
| H01L 21/306 | (2006.01) | |
| H01L 21/033 | (2006.01) | |
| H01L 21/027 | (2006.01) | |

(52) U.S. Cl.
CPC .... *H01L 27/10891* (2013.01); *H01L 21/0217* (2013.01); *H01L 21/02164* (2013.01); *H01L 21/02211* (2013.01); *H01L 21/02271* (2013.01); *H01L 21/0332* (2013.01); *H01L 21/3081* (2013.01); *H01L 21/3086* (2013.01); *H01L 21/30604* (2013.01); *H01L 27/10823* (2013.01); *H01L 27/10855* (2013.01); *H01L 27/10876* (2013.01); *H01L 21/0273* (2013.01)

(58) Field of Classification Search
None
See application file for complete search history.

(56) References Cited

U.S. PATENT DOCUMENTS

| | | | |
|---|---|---|---|
| 9,478,415 B2 | 10/2016 | Kimura | |
| 2003/0096476 A1* | 5/2003 | Bloom | H01L 21/28194 438/257 |
| 2012/0070951 A1* | 3/2012 | Hosaka | H01L 21/76229 438/287 |
| 2015/0079767 A1* | 3/2015 | Myung | H01L 29/41741 438/478 |

* cited by examiner

*Primary Examiner* — Asok K Sarkar
(74) *Attorney, Agent, or Firm* — Winston Hsu

(57) ABSTRACT

A method of fabricating a DRAM includes providing a substrate. Later, a first mask layer is formed to cover the substrate. The first mask layer includes a hydrogen-containing silicon nitride layer and a silicon oxide layer. The hydrogen-containing silicon nitride layer has the chemical formula: $Si_xN_yH_z$, wherein x is between 4 and 8, y is between 3.5 and 9.5, and z equals 1. After that, the first mask layer is patterned to form a first patterned mask layer. Next, the substrate is etched by taking the first patterned mask layer as a mask to form a word line trench. Subsequently, the first patterned mask layer is removed entirely. Finally, a word line is formed in the word line trench.

6 Claims, 4 Drawing Sheets

US 10,446,559 B2

METHOD OF FABRICATING DRAM

BACKGROUND OF THE INVENTION

1. Field of the Invention

The present invention relates to a method of fabricating a DRAM, and more particularly to a fabricating method which prevents a word line from breaking.

2. Description of the Prior Art

A dynamic random access memory (DRAM) is a volatile memory formed from a plurality of memory cells. Each memory cell comprises a transistor and a capacitor controlled by the transistor. The memory cells are electrically connected with one another via word lines and bit lines.

In order to improve the integration of DRAMs to increase their operating speed and to meet consumers' demand for miniaturization of electronic devices, buried word line DRAMs have been developed in recent years.

During the formation of a buried word line, a word line trench needs to be formed in the substrate. When using a conventional method to form the word line trench, common problems are that there are fractures in the word line trench or the width of a same word line trench is not consistent. The fractures and different widths lead to electrical problems in the buried word line.

SUMMARY OF THE INVENTION

This in mind, the present invention provides a fabricating method of a word line which can prevents defects in the word line.

According to a preferred embodiment of the present invention, a method of fabricating a DRAM includes providing a substrate. Later, a first mask layer is formed, wherein the steps of forming the first mask layer comprise forming a hydrogen-containing silicon nitride layer to cover the substrate, and forming a silicon oxide layer to cover and contact the hydrogen-containing silicon nitride layer. The hydrogen-containing silicon nitride layer has the chemical formula: $Si_xN_yH_z$, wherein x is between 4 and 8, y is between 3.5 and 9.5, and z equals 1. Next, the first mask layer is patterned to form a first patterned mask layer. Subsequently, the substrate is etched by taking the first patterned mask layer as a mask to form a word line trench. After that, the first patterned mask layer is removed entirely. Finally, a word line is formed in the word line trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 7 depict a fabricating method of a DRAM according to a preferred embodiment of the present invention, wherein:

FIG. 1 depicts a stage of providing a substrate with STIs;
FIG. 2 is a fabricating stage following FIG. 1;
FIG. 3 is a fabricating stage following FIG. 2;
FIG. 4 is a fabricating stage following FIG. 3;
FIG. 5 is a fabricating stage following FIG. 4;
FIG. 6 is a fabricating stage following FIG. 5; and
FIG. 7 is a fabricating stage following FIG. 6.

DETAILED DESCRIPTION

Figure 1:
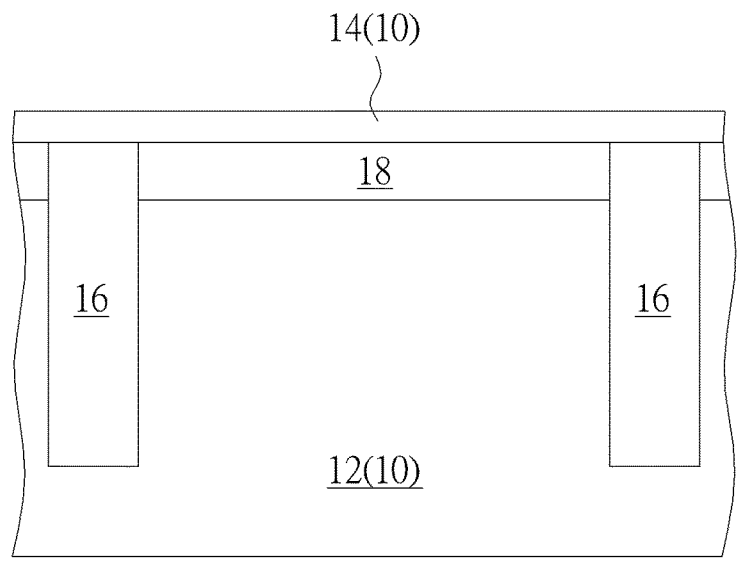

FIG. 1 to FIG. 7 depict a fabricating method of a DRAM according to a preferred embodiment of the present invention. As shown in FIG. 1, a substrate 10 is provided. The substrate 10 includes a semiconductor substrate 12 and optionally includes a protective layer 14. The semiconductor substrate 12 may be a silicon substrate or a silicon germanium substrate. The protective layer 14 may be silicon oxide, silicon nitride, silicon oxynitride or other insulating materials. According to a preferred embodiment, the thickness of the protective layer 14 is between 470 and 580 angstroms. At least one shallow trench isolation (STI) 16 is disposed on the semiconductor substrate 12. The STI 12 defines an active region on the semiconductor substrate 12. Later, an ion implantation process is performed to form a doping region 18 in the semiconductor substrate 12. The dopants which are implanted into the semiconductor substrate 12 may be N-type or P-type.

Figure 2:
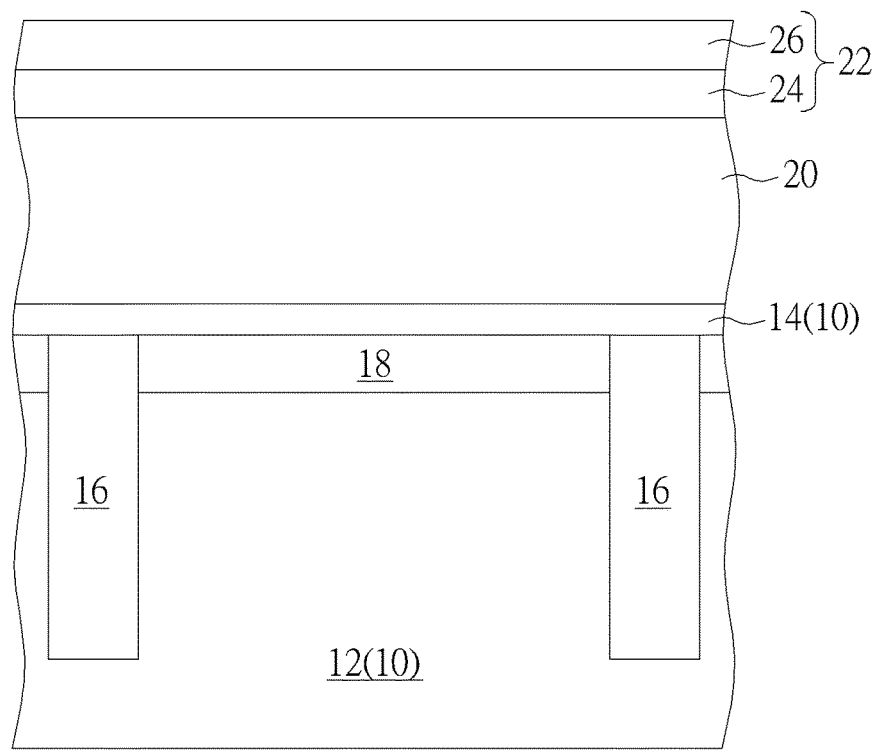

As shown in FIG. 2, a second mask layer 20 is formed to cover the protective layer 14. The second mask layer 20 can be an advanced patterning film (APF) or other materials such as silicon oxide, silicon nitride or silicon oxynitride. Later, a first mask layer 22 is formed to cover the second mask layer 20, wherein the first mask layer 22 includes a hydrogen-contain silicon nitride layer 24 and a silicon oxide layer 26. The hydrogen-contain silicon nitride layer 24 is formed before the silicon oxide layer 26. According to a preferred embodiment of the present invention, the thickness of the second mask layer 20 is between 1350 and 1650 angstroms. The thickness of the hydrogen-contain silicon nitride layer 24 is between 630 and 700 angstroms. The thickness of the silicon oxide layer 26 is between 380 and 460 angstroms.

Generally speaking, a silicon atom and a hydrogen atom in the hydrogen-contain silicon nitride layer 24 will form a dangling bond with each other. Because the hydrogen-contain silicon nitride layer 24 has a lot of silicon atoms and a lot of hydrogen atoms, there are numerous dangling bonds in the hydrogen-contain silicon nitride layer 24. During the formation of the silicon oxide layer 26, the oxygen atoms in the silicon oxide layer 26 react with the dangling bonds, causing the surface of the silicon oxide layer 26 to become rough due to the reaction. This means the more hydrogen atoms in the hydrogen-contain silicon nitride layer 24, the rougher the surface of the silicon oxide layer 26. In order to prevent the surface of the silicon oxide layer 26 from becoming rough, the ratio of the hydrogen atoms in the hydrogen-contain silicon nitride layer 24 is controlled. In detail, the hydrogen-contain silicon nitride layer 24 has the chemical formula: $Si_xN_yH_z$, wherein x is between 4 and 8, y is between 3.5 and 9.5, and z equals 1. The hydrogen-contain silicon nitride layer 24 can be formed by a deposition process such as an atomic layer deposition (ALD), a chemical vapor deposition (CVD), a physical vapor deposition (PVD), etc. The steps of the deposition include sending the semiconductor substrate 12 into a chamber (not shown). Next, silane and ammonia are introduced into the chamber to form the hydrogen-contain silicon nitride layer 24. A flow rate of the silane is between 22.5 and 27.5 standard cubic centimeters per minute (SCCM), and a flow rate of the ammonia is between 45 and 55 SCCM. An operation temperature of the deposition process is between 360 and 440 Celsius degrees, an operation pressure is between 5.4 and 6.6 torrs, and an operation power is between 72 and 88 watts.

After the hydrogen-contain silicon nitride layer 24 is formed, a silicon oxide layer 26 is formed to cover the hydrogen-contain silicon nitride layer 24. The silicon oxide layer 26 is preferably formed by ALD, CVD, or PVD. Because the ratio of the hydrogen atoms in the hydrogen-contain silicon nitride layer 24 is controlled to be below a certain level, the surface of the silicon oxide layer 26 in this embodiment is smooth.

Figure 3:
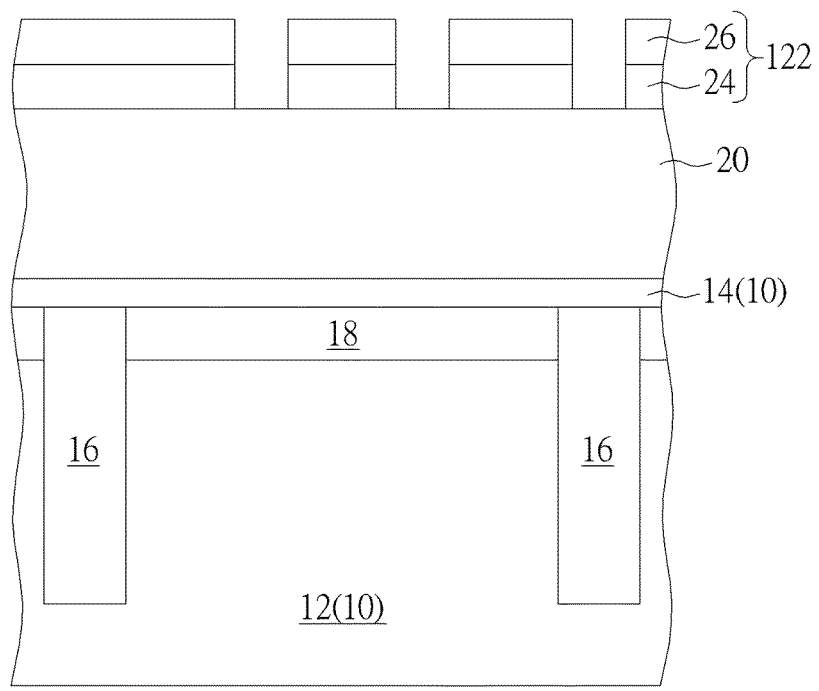

As shown in FIG. 3, the first mask layer 22 is patterned to form a first patterned mask layer 122. The steps of patterning the first mask layer 22 may include forming a photoresist (not shown) to cover the first mask layer 22. Then, the photoresist is patterned by using a lithographic process to forma pattern of word line trenches within the photoresist. Because the surface of the silicon oxide layer 26 is smooth/flat, the surface of the photoresist on the silicon oxide layer 26 is also smooth/flat. In this way, there is no distortion in the photoresist after the lithographic process. Later, the pattern within the photoresist is transferred to the first mask layer 22 to make the first mask layer become a first patterned mask layer 122 by using an etching process. Because of the smooth surface of the silicon oxide layer 26, the pattern on the photoresist can be transferred to the first mask layer 22 accurately. After that, the photoresist is removed.

Figure 4:
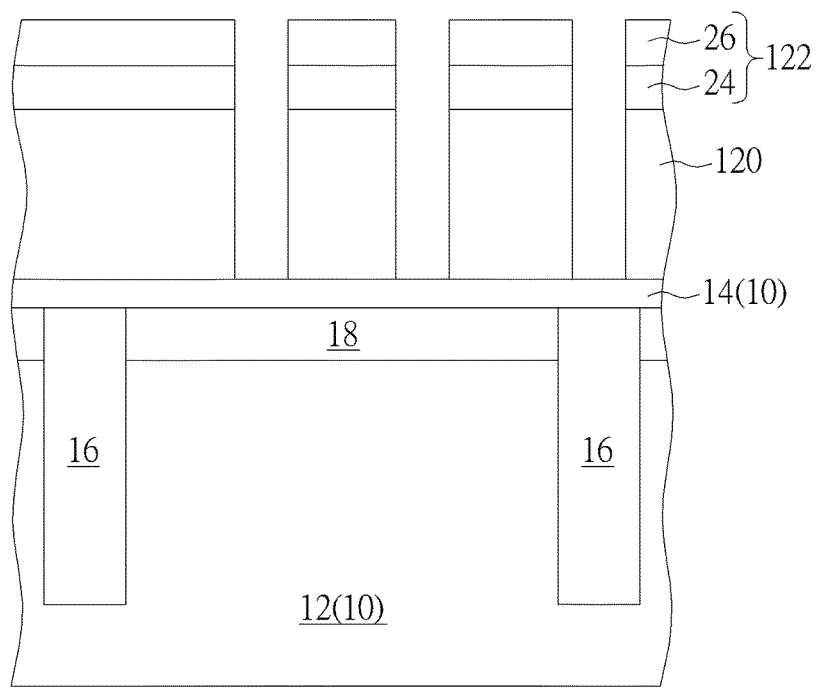
Figure 5:
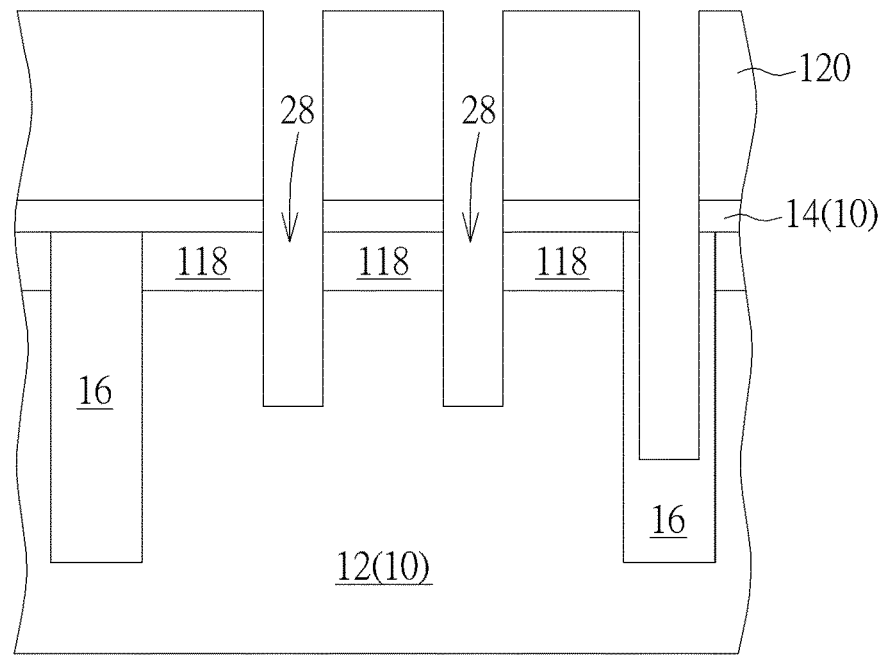

As shown in FIG. 4, the second mask layer 20 is etched to form a second patterned mask layer 120 by taking the first patterned mask layer 122 as a mask. As shown in FIG. 5, the first patterned mask layer 122 is removed. Later, the protective layer 14, the semiconductor substrate 12 and the STI 16 are etched by using the second patterned mask layer 120 as a mask to form a word line trench 28 in the semiconductor substrate 12 and the STI 16. In this embodiment, there are three word line trenches 28 shown as an example. The word line trench 28 separates the doping region 18 into several source/drain doping regions 118. The source/drain doping regions 118 are respectively at two sides of each of the word line trenches 28.

Figure 6:
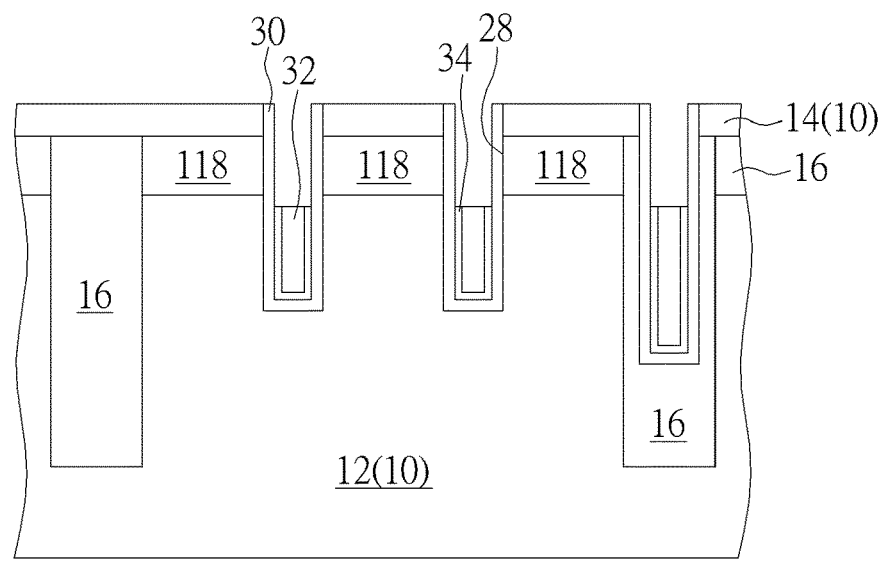

As shown in FIG. 6, the second patterned mask layer 120 is removed. Then, a gate dielectric layer 30 is formed on the sidewall and the bottom of the word line trenches 28. The gate dielectric layer 30 may be silicon oxide, silicon oxynitride, silicon nitride or high-k materials. The gate dielectric layer 30 can be formed by an oxidation process or a deposition process. Next, a word line 32 and a work function layer 34 are formed at a lower portion of each of the word line trenches 28. The steps of forming the word line 32 and the work function layer 34 include forming a work function material to conformally cover the gate dielectric layer 30. Later, a conductive layer is formed to fill in the word line trenches 28. After that, the work function material and the conductive layer are etched back to remove the work function material and the conductive layer at the upper portion of each of the word line trenches 28. The work function material remaining at the lower portion of each of the word line trenches 28 serves as the work function layer 34, and the conductive layer remaining at the lower portion of each of the word line trenches 28 serves as the word line 32. The work function layer 34 may be silicon nitride, silicon tantalum or tungsten nitride (WN). The word line 32 may be tungsten, copper, aluminum or other conductive materials.

Figure 7:
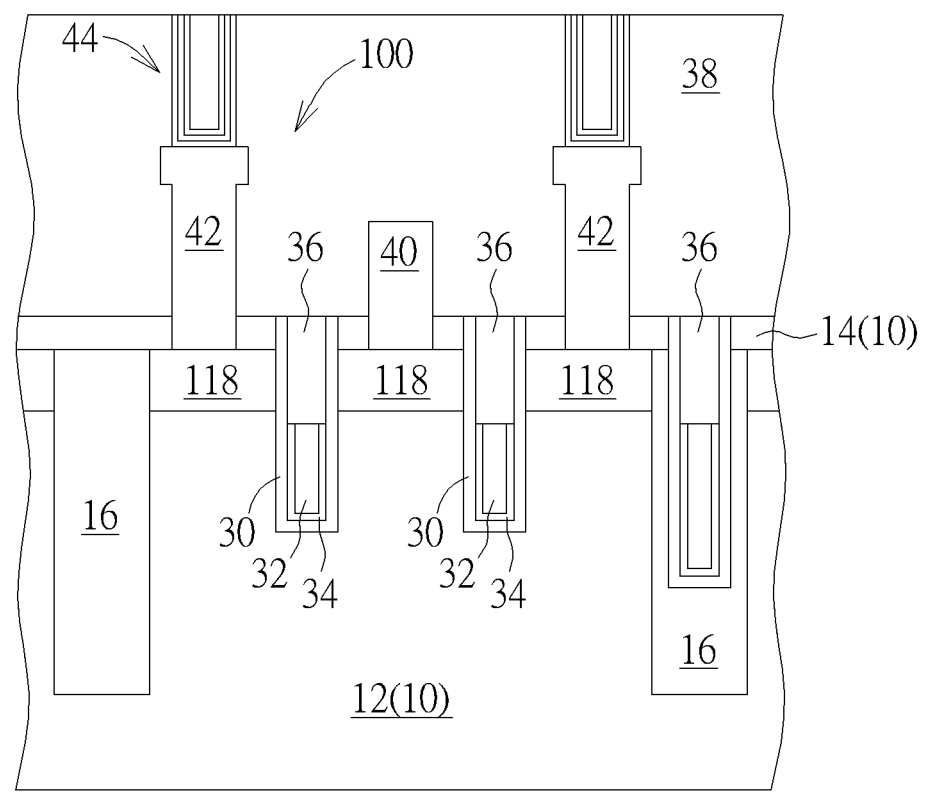

As shown in FIG. 7, a cap layer 36 is formed to fill in the upper portion of each of the word line trenches 28. The cap layer 36 may be silicon nitride or other insulating materials. Later, an interlayer dielectric layer 38, a bit line plug 40, a contact plug 42 and a capacitor 44 are formed. At this point, a dynamic random access memory (DRAM) structure is completed. The capacitor plug 42 electrically connects to the capacitor 44 and a source/drain doping region 117. A bit line plug 40 electrically connects to another source/drain doping region 118.

The hydrogen-containing silicon nitride layer used in the present invention has a lower ratio of hydrogen atoms. Therefore, the total number of dangling bonds between hydrogen atoms and silicon atoms is decreased. In this way, the possibility of the oxygen atoms in the silicon oxide layer reacting with the dangling bonds is reduced, and the rough surface of the silicon oxide layer can be prevented. In other words, the silicon oxide layer can have a smooth surface, and the word line trench can be formed accurately.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a DRAM, comprising:
providing a substrate; and
forming a first mask layer, wherein the steps of forming the first mask layer comprise:
  forming a hydrogen-containing silicon nitride layer to cover the substrate, and forming a silicon oxide layer to cover and contact the hydrogen-containing silicon nitride layer, wherein the hydrogen-containing silicon nitride layer has the chemical formula: $Si_xN_yH_z$, wherein x is between 4 and 8, y is between 3.5 and 9.5, and z equals 1;
  patterning the first mask layer to form a first patterned mask layer;
  etching the substrate by taking the first patterned mask layer as a first mask to form a word line trench;
  removing the first patterned mask layer entirely; and
  forming a word line in the word line trench.

2. The method of fabricating a DRAM of claim 1, wherein the substrate comprises a semiconductor substrate and a second mask layer covering the semiconductor substrate.

3. The method of fabricating a DRAM of claim 2, wherein the fabricating steps of the word line comprise:
etching the second mask layer to forma second patterned mask layer by taking the first patterned mask layer as a second mask;
removing the first patterned mask layer;
etching the semiconductor substrate to form the word line trench by taking the second patterned mask layer as a third mask; and
removing the second patterned mask layer.

4. The method of fabricating a DRAM of claim 1, further comprising:
forming a doping region in the substrate before forming the first mask layer;
forming a capacitor plug to contact the doping region after forming the word line; and
forming a capacitor on the substrate to complete the DRAM after forming the word line, wherein the capacitor electrically connects to the word line through the doping region and the capacitor plug.

5. The method of fabricating a DRAM of claim 1, wherein the hydrogen-containing silicon nitride layer is formed by a deposition process, and the deposition process comprises:
forming the hydrogen-containing silicon nitride layer by using silane and ammonia as precursors, wherein a flow rate of the silane is between 22.5 and 27.5 SCCM, and a flow rate of the ammonia is between 45 and 55 SCCM.

6. The method of fabricating a DRAM of claim 5, wherein an operation temperature of the deposition process is between 360 and 440 degrees Celsius, an operation pressure is between 5.4 and 6.6 torrs, and an operation power is between 72 and 88 watts.

\* \* \* \* \*